(12) United States Patent
Kawamura

(10) Patent No.: US 7,365,528 B2
(45) Date of Patent: Apr. 29, 2008

(54) METHOD AND APPARATUS OF VOLTAGE MEASUREMENT USING FLYING CAPACITOR AND SWITCHING CIRCUITS

(75) Inventor: Yoshihiro Kawamura, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/540,534

(22) Filed: Oct. 2, 2006

(65) Prior Publication Data

US 2007/0078616 A1 Apr. 5, 2007

(30) Foreign Application Priority Data

Oct. 3, 2005 (JP) ............................. 2005-290344

(51) Int. Cl.
  G01R 1/02 (2006.01)
  G01R 7/00 (2006.01)
  G01R 19/25 (2006.01)
(52) U.S. Cl. .................... 324/131; 324/142; 324/99 D
(58) Field of Classification Search ................ 324/131, 324/142, 99 D
  See application file for complete search history.

(56) References Cited

U.S. PATENT DOCUMENTS

| 2,497,961 | A | * | 2/1950 | Shaw ........................ 324/99 D |
| 2,981,107 | A | * | 4/1961 | Anderson .................... 374/167 |
| 3,132,338 | A | * | 5/1964 | Schmid ....................... 341/164 |
| 3,383,594 | A | * | 5/1968 | Fiorletta et al. ........ 324/121 R |
| 3,714,569 | A | * | 1/1973 | Bruning et al. ............. 324/131 |
| 3,778,710 | A | * | 12/1973 | Snook ..................... 324/123 R |
| 4,789,824 | A | * | 12/1988 | Henkelmann ............... 324/114 |
| 4,795,972 | A | * | 1/1989 | Roppelt et al. ............. 324/115 |
| 6,362,627 | B1 | * | 3/2002 | Shimamoto et al. ........ 324/434 |
| 6,639,409 | B2 | * | 10/2003 | Morimoto et al. .......... 324/434 |

* cited by examiner

*Primary Examiner*—Benny Q. Tieu
*Assistant Examiner*—Karen M Kusumakar
(74) *Attorney, Agent, or Firm*—Kratz, Quintos & Hanson, LLP

(57) ABSTRACT

The present invention is to provide a method and apparatus of voltage measurement with a high resolution. An apparatus of voltage measurement includes: a buffer circuit for separating a voltage between terminals of a capacitor or an equivalent voltage into a first voltage region corresponding to a full scale of an analog/digital (A/D) converter and a second voltage region corresponding to a voltage exceeding the full scale of the A/D converter when the voltage between the terminals of the capacitor charged or the equivalent voltage is higher than the full scale of the A/D converter; the A/D converters corresponding to the first and second voltage regions for converting the voltages of the respective regions from analog to digital values; and a voltage measurement device for evaluating a measured voltage value from the digital values and calculating the voltage of the voltage supply.

12 Claims, 5 Drawing Sheets

METHOD AND APPARATUS OF VOLTAGE MEASUREMENT USING FLYING CAPACITOR AND SWITCHING CIRCUITS

BACKGROUND OF THE INVENTION

1. Field of the Invention

The present invention relates to a method and an apparatus of voltage measurement, and more specifically to a method and an apparatus having a high resolution for measuring an individual voltage of a voltage supply among a plurality of voltage supplies connected in series and having a high voltage.

2. Description of the Related Art

An electric motor vehicle has a high voltage supply which is formed with a plurality of batteries (voltage supplies) connected in series. JP, H11-248755, A discloses a flying capacitor method for measuring voltage of each voltage supply of a plurality of batteries.

FIG. 6 shows a conventional circuit of the flying capacitor method of voltage measurement. The circuit of the flying capacitor method includes a first multiplexer 1 and second multiplexer 2 connected to terminals T1-T6 of a high voltage supply V, a bipolar capacitor 3, a sampling switch 4, a microcomputer 7, a reference voltage supply circuit (hereafter Vref circuit) 8, and a buffer filter 9.

The microcomputer 7 has a voltage port Vcc connected to a driving voltage supply +Vcc and input ports A/D1 and A/D2. The microcomputer 7 has an analog/digital (A/D) converter to convert an analog voltage inputted to the input ports A/D1 and A/D2 to a digital value.

The Vref circuit 8 has resistors R1-R3, a first and second switches 8a and 8b, and a reference voltage supply +Vref. Each terminal of the resistor R1 is connected to a switch 4a and the resistor R3, respectively and each terminal of the resistor R2 is connected to a switch 4b and the resistor R3, respectively. The resistors R1-R3 form a divider circuit. One end of the first switch 8a is connected to a junction of the resistors R2 and R3 and another end thereof is connected to the reference voltage supply +Vref, which supplies a high voltage or maximum voltage of a measurement full scale value in the microcomputer 7. One end of the second switch 8b is connected to the junction of the resistors R2 and R3, and another end thereof is connected to the ground, which supplies a low voltage or minimum voltage of the measurement full scale value in the microcomputer 7.

The voltage of the reference voltage supply +Vref is set equal to that of the driving voltage supply +Vcc or set to +AVcc ($\leq$+Vcc))

The buffer filter 9 is connected a junction of the resistors R1 and R3, and the input port A/D1 of the microcomputer 7 for eliminating noise inputted to the input port A/D1.

The process of voltage measurement is explained. First, all switches S1-S6, 4a-4b, 8a-8b are opened. When the switches S1 and S2 of the respective multiplexers 1 and 2 are closed, a voltage supply V1, the terminals T1 and T2, the switches S1 and S2, and the capacitor 3 form a closed circuit so that the voltage supply V1 can charge the capacitor 3.

Then, the switches S1-S2 are opened and the second switch 8b is closed and the switches 4a-4b of the sampling switch 4 are closed for a prescribed period of time to supply a voltage between the terminals of the capacitor 3, or the voltage of the voltage supply V1, to the input ports A/D1 and A/D2 through the resistors R1-R3.

Since the second input port A/D2 is connected to the ground (0V), the voltage of the voltage supply V1 is supplied to the first input port A/D1. The microcomputer 7 calculates an absolute value of the voltage difference between the first and second input ports A/D1 and A/D2, |V(A/D1)-V(A/D2)|, and stores the calculated result as a measured voltage value of the voltage supply V1.

When the switches S2-S3 are closed after all switches are opened, a voltage supply V2, the terminals T2 and T3, the switches S2-S3, and the capacitor 3 form a closed circuit so that the voltage supply V2 can charge the capacitor 3 with reverse polarity in contrast with the case of the voltage supply V1.

Then, the switches S2-S3 are opened and the first switch 8a is closed and the switches 4a-4b of the sampling switch 4 are closed for a prescribed period of time to supply a voltage between the terminals of the capacitor 3, or the voltage of the voltage supply V2, to the input ports A/D1 and A/D2 through the resistors R1-R3.

Since the second input port A/D2 is connected to the reference voltage supply +Vref, the first input port A/D1 is supplied with the voltage of the voltage supply V2 and the reference voltage +Vref (+AVcc). The microcomputer 7 calculates an absolute value of the voltage difference between the first and second input ports A/D1 and A/D2, |V(A/D1)-V(A/D2)|, and stores the calculated result as a measured voltage value of the voltage supply V2.

The same processes are repeated with combinations of the switches S3-S4, S4-S5, S5-S6, and so on to measure the respective voltage of the voltage supplies V3-V5 and store the measured voltage values in the microcomputer 7.

In the measurement described above, the voltages of the odd numbered voltage supplies V1, V3, V5 charge the capacitor 3 and supply the microcomputer 7 with the reverse polarity compared to the even numbered voltage supplies V2, V4. The second input port A/D2 is supplied with the voltage of the reference voltage supply +Vref (+AVcc) or 0 volt as the reference voltage. The voltages of the odd numbered voltage supplies V1, V3, V5 are converted to a full scale of the A/D converter, 0V (min) to +AVcc (max), at the first input port A/D1. The voltages of the even numbered voltage supplies V2, V4 are converted to a full scale of the A/D converter, +AVcc (min) to 0V (max), at the first input port A/D1. FIG. 7 illustrates a manner of the conversion.

The full scale value for the voltage measurement is selected as +AVcc as the high voltage or maximum voltage and 0V as the low voltage or minimum voltage in the microcomputer 7 for the voltage measurement apparatus with the flying capacitor method. The voltages of the odd numbered voltage supplies V1, V3, V5 are detected in the range of 0V to +AVcc and the even numbered voltage supplies V2, V4 are detected in the range of +AVcc to 0V. Accordingly, when the +Vcc is 5V and +AVcc is equal to +Vcc, the odd numbered voltages are in the range of 0-5V and the even numbered voltages are in the range of 5-0V.

The conventional A/D converter disposed in the microcomputer 7 has a limited resolution of 5V full scale/10 bits (resolution 0.005 V) for the voltage measurement apparatus with the flying capacitor method as shown in FIG. 6.

When the voltage supplies V1-V5 each having a voltage of 0-20V is detected with 5V full scale utilizing the conventional A/D converter of the microcomputer 7, it is necessary to divide the voltage of V1-V5 with 4:1 to detect. The voltage dividing of 4:1 degrades the resolution of the A/D converter from 0.005V to 0.02V.

SUMMARY OF THE INVENTION

An object of the present invention is to provide a method and apparatus of voltage measurement having a high resolution.

According to a first aspect of the present invention, a method of voltage measurement comprises the steps of: charging a capacitor with a voltage supply to be measured about voltage; converting a voltage between terminals of the capacitor charged or an equivalent voltage thereof from analog to digital value with an analog/digital (A/D) converter; evaluating a measured voltage value from the digital value; and calculating the voltage of the voltage supply from the measured value, wherein when the voltage between the terminals of the capacitor or the equivalent voltage is higher than a full scale of the A/D converter, the voltage is separated into a first voltage region corresponding to the full scale of the A/D converter and a second voltage region corresponding to a voltage exceeding the full scale of the A/D converter, and wherein voltages of the first and second voltage regions are converted from analog to digital with respective A/D converters.

Preferably, the voltage of the voltage supply is calculated by adding the measured voltage value of the second voltage region to the voltage of the full scale of the A/D converter.

Preferably, the voltage of the voltage supply is calculated by adding the measured voltage value of the first voltage region to the measured voltage value of the second voltage region.

According to a second aspect of the present invention, an apparatus of voltage measurement comprises: a buffer circuit for separating a voltage between terminals of a capacitor or an equivalent voltage into a first voltage region corresponding to a full scale of an analog/digital (A/D) converter and a second voltage region corresponding to a voltage exceeding the full scale of the A/D converter when the voltage between the terminals of the capacitor charged or the equivalent voltage is higher than the full scale of the A/D converter; the A/D converters corresponding to the first and second voltage regions for converting the voltages of the respective regions from analog to digital values; and a voltage measurement device for evaluating a measured voltage value from the digital values and calculating the voltage of the voltage supply.

According to a third aspect of the present invention, an apparatus of voltage measurement includes: a capacitor to be charged with a voltage supply; a first multiplexer for connecting odd numbered terminals of voltage supplies connected in series to the capacitor; a second multiplexer for connecting even numbered terminals of the voltage supplies connected in series to the capacitor; a sampling switch for supplying a voltage between terminals of the capacitor or an equivalent value to a voltage measurement device; a buffer circuit for separating the voltage between the terminals of the capacitor or the equivalent voltage into a first voltage region corresponding to a full scale of an analog/digital (A/D) converter and a second voltage region corresponding to a voltage exceeding the full scale of the A/D converter when the voltage between the terminals of the capacitor or the equivalent voltage is higher than the full scale of the A/D converter; the A/D converters corresponding to the first and second voltage regions for converting the voltages of the respective regions from analog to digital values; and the voltage measurement device for evaluating a measured voltage value from the digital values and calculating the voltage of the voltage supply.

Preferably, the voltage measurement device calculates the voltage of the voltage supply by adding the measured voltage value of the second voltage region to the voltage of the full scale of the A/D converter.

Preferably, the voltage measurement device calculates the voltage of the voltage supply by adding the measured voltage value of the first voltage region to the measured voltage value of the second voltage region.

Preferably, the buffer circuit supplied with a driving voltage comparable to the full scale has a buffer amplifier supplied with the voltage between the terminals of the capacitor or the equivalent voltage and a differential amplifier supplied with a reference voltage equal to the full scale of the A/D converter at one input terminal and the voltage between the terminals of the capacitor at another input terminal, and wherein the A/D converter has a first A/D converter for converting an output voltage of the buffer amplifier from analog to digital and a second A/D converter for converting an output voltage of the differential amplifier from analog to digital.

Preferably, the apparatus of voltage measurement further includes a divider circuit for dividing the voltage between the terminals of the capacitor and supplying the voltage divided to the buffer circuit as the equivalent voltage.

Preferably, the sampling switch has a first switch connected to a first terminal of the capacitor and a second switch connected to a second terminal of the capacitor, wherein the divider circuit has a first resistor, one terminal of which is connected to the first switch, a second resistor, one terminal of which is connected to the second switch, and a third resistor connected to another terminals of the first and second resistors, wherein the voltage measurement device has a first switching unit for grounding the one terminal of the third resistor when measuring the voltage of the odd numbered voltage supply and a second switching unit for grounding the another terminal of the third resistor when measuring the voltage of the even numbered voltage supply.

Preferably, the output voltage of the buffer amplifier is supplied to the another input terminal of the differential amplifier and the buffer amplifier operates as the reference voltage supply.

DETAILED DESCRIPTION OF THE PREFERRED EMBODIMENTS

Embodiments of the present invention are explained by referring to drawings.

Figure 1:
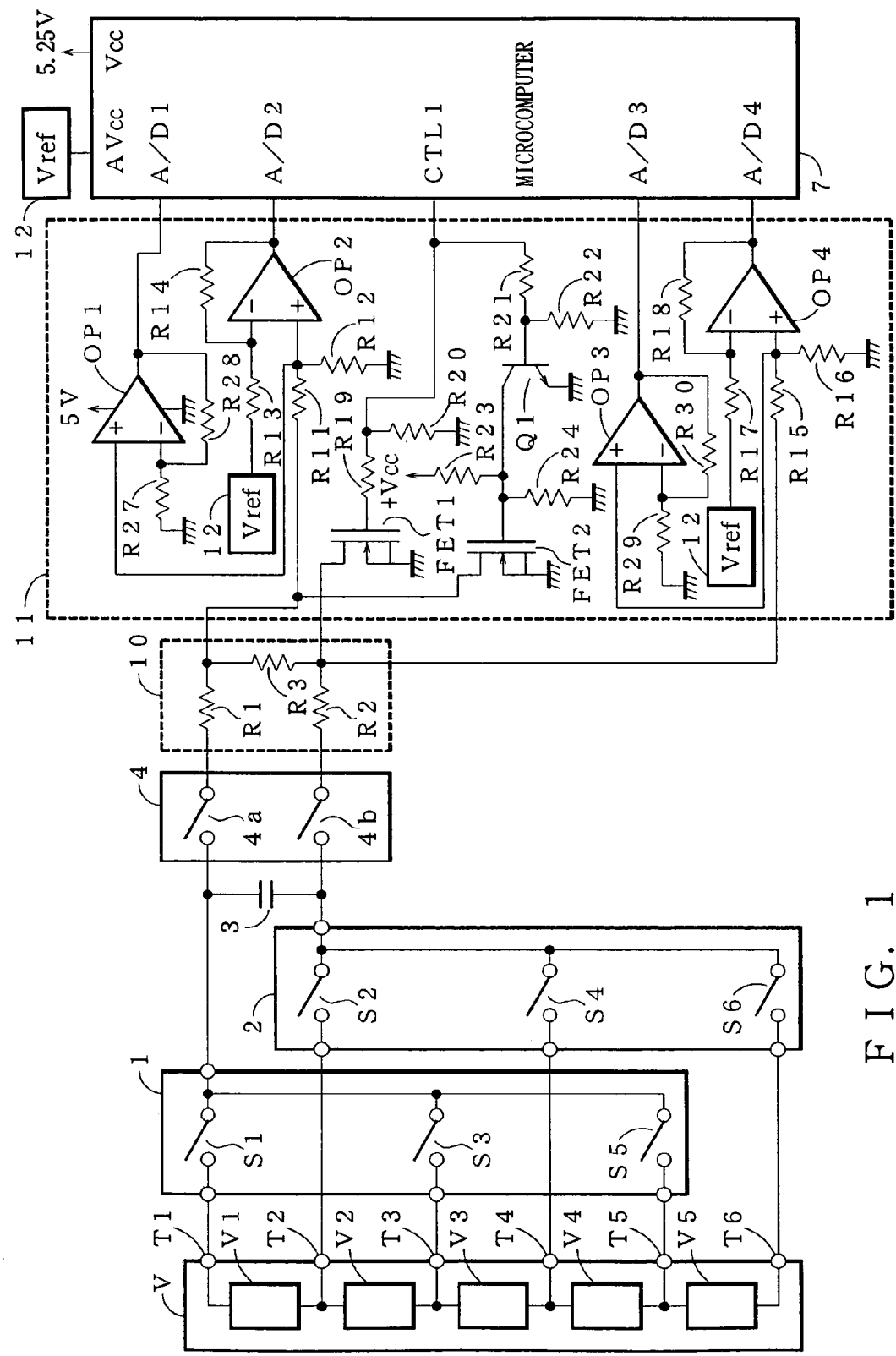
FIG. 1 is a circuit of a first embodiment of an apparatus of voltage measurement of the present invention.

FIG. 1 shows a circuit of a first embodiment of an apparatus of voltage measurement utilizing a method of voltage measurement of the present invention. The apparatus of voltage measurement is a flying capacitor method and includes a first multiplexer 1 and second multiplexer 2 connected to terminals T1-T6 of a high voltage supply V, a bipolar capacitor 3, a sampling switch 4, a microcomputer 7, a divider circuit 10, and a buffer circuit 11.

The high voltage supply V has N of voltage supplies, for example electric cells, each having a voltage of 0-20V, connected in series. In this embodiment, N is 5 and each voltage supply denoted as V1-V5 is connected to the respective terminals of T1-T6.

The first multiplexer 1 has switches S1, S3, S5 connected to the respective terminals T1, T3, T5. The second multiplexer 2 has switches S2, S4, S6 connected to the respective terminals T2, T4, T6.

The switches S1, S3, S5 of the first multiplexer 1 are connected to a first terminal of the capacitor 3 and the switches S2, S4, S6 of the second multiplexer 2 are connected to a second terminal of the capacitor 3.

The sampling switch 4 has a first switch 4a and a second switch 4b connected to the first and second terminals of the capacitor 3, respectively.

The microcomputer 7 has an electric power port AVcc connected to a reference voltage supply Vref 12 supplying an accurate driving voltage of 5V to built-in A/D converters, an electric power port Vcc connected to a voltage supply supplying a driving voltage of 5.25V to devices other than the built-in A/D converters, input ports A/D1-A/D4, and an output port CTL1 for outputting a control signal. The A/D converters are connected to the input ports A/D1-A/D4 and convert analog voltages inputted to the input ports A/D1-A/D4 into digital values. The A/D converters have a resolution of 5V full scale/10 bits (resolution of 0.005V). The microcomputer 7 includes a voltage measurement device, the A/D converters including a first A/D and a second A/D converters.

The divider circuit 10 has a first, a second, and a third resistors R1-R3. The resistors R1 and R2 are connected to the first and second switches 4a and 4b, respectively. The resistor R3 is connected to the resistors R1 and R2.

The buffer circuit 11 has operational amplifiers, hereafter op-amp, OP1-OP4 of rail to rail type driven with 5V, field effect transistors FET1-FET2, a transistor Q1, and resistors R11-R24 and R27-R30. The resistors R11-R18 and R27-R30 have a same resistance value. A non-inverting input terminal of the op-amp OP1 is connected to a non-inverting input terminal of the op-amp OP2 and an inverting input terminal thereof is connected to an output terminal via the resistor R28 and the ground via the resistor R27. The output terminal of the op-amp OP1 is connected to the input port A/D1. The non-inverting input terminal of the op-amp OP2 is connected to a junction of the first and third resistors R1 and R3 via the resistor R11 and the ground via the resistor R12. An inverting input terminal of the op-amp OP2 is connected to a reference voltage supply 12 via the resistor R13 and an output terminal via the resistor R14. The output terminal of the op-amp OP2 is connected to the input port A/D2 of the microcomputer 7.

A non-inverting input terminal of the op-amp OP3 is connected to a non-inverting input terminal of the op-amp OP4 and an inverting input terminal is connected to an output terminal thereof via the resistor R30 and the ground via the resistor R29. The output terminal of the op-amp OP3 is connected to the input port A/D3 of the microcomputer 7. The non-inverting input terminal of the op-amp OP4 is connected to a junction of the resistors R2 and R3 via R15 and the ground via the resistor R16, and an inverting input terminal is connected to the reference voltage supply 12 via the resistor R17 and an output terminal thereof via the resistor R18. The output terminal is connected to the input port A/D4 of the microcomputer 7. The op-amps OP1 and OP3 are buffer amplifiers and op-amps OP2 and OP4 are differential amplifiers.

A gate of a field effect transistor FET1 is connected to the output port CTL1 via the resistor 19, a source thereof is connected to the ground, and a drain thereof is connected to the junction of the resistors R2 and R3. A gate of a field effect transistor FET2 is connected to a voltage supply +Vcc via the resistor R23 and the ground via the resistor R24 and an collector of a transistor Q1, a source thereof is connected to the ground, and a drain thereof is connected to the junction of the resistors R1 and R3. A base of the transistor Q1 is connected to the output port CTL1 via the resistor 21 and the ground via the resistor R22 and an emitter thereof is connected to the ground. The field effect transistors FET1 and FET2 form a first switching unit and second switching unit, respectively.

The resistance values of the resistors R1-R3 of the divider circuit 10 are set 2R1=2R2=R3 resulting to a divider ratio of 2:1. The apparatus of voltage measurement of the present invention utilizes the ground (GND) as the reference voltage for A/D conversion by changing the reference points when the voltages of both odd and even numbered voltage supplies are measured. The present apparatus has differential amplifiers for detecting separately a voltage of 0-10V (A/D input) and a voltage of 10-20V (A/D input) for the voltage supply.

The voltage between the terminals of the capacitor charged with different polarities depending on the odd and even numbered voltage supplies has always a positive voltage with the reference voltage of the ground so that a plus/minus power supply or signal processing device is not required and resulting to a low cost. Since a radiation noise from a DC/DC converter of the plus/minus power supply is prevented so that the apparatus of voltage measurement with a low price and high resolution is achieved.

The voltage measurement utilizing the apparatus with the flying capacitor method as described above is explained below.

All switches S1-S6 of the first and second multiplexers 1 and 2, and the first and second switches 4a and 4b of the sampling switch 4 are opened. The switches S1-S2 of the first and second multiplexers 1-2 are closed. The voltage supply V1, the terminal T1-T2, the switches S1-S2, the capacitor 3 form a closed circuit. Thus, the voltage supply V1 charges the capacitor 3.

Then, the switches S1 and S2 are opened and the FET1 is turned on and FET2 is turned off with a high level (H) control signal from the output port CTL1 of the microcomputer 7. The first and second switches 4a and 4b of the sampling switch 4 are closed for a prescribed period of time to supply the voltage between the terminals of the capacitor 3, or the voltage supply V1, to the input ports A/D1 and A/D2 via the sampling switch 4, the divider circuit 10, and the buffer circuit 11.

When the voltage of the voltage supply V1 is in the range of 0-10V, the voltage of the capacitor 3 is divided with the divider circuit 10 in a ratio of 2:1 resulting to 0-5V and divided further with the resistors R11 and R12 in ratio of 2:1 resulting to 0-2.5V and the resulting voltage is inputted to the op-amp OP1. The inputted voltage is amplified with the op-amp OP1 with amplification of 2 resulting to the range of 0-5V and supplied to the input port A/D1 of the microcomputer 7. Accordingly, when the voltage supply V1 has the voltage in the range of 0-10V, the voltage in the range of 0-5V is applied to the input port A/D1. The A/D converter of 5V full scale effectively operates in this voltage range without overflowing.

When the field effect transistor FET1 is turned on, the junction of the resistors R2 and R3 is grounded and the non-inverting input terminal of the op-amp OP3 becomes the ground voltage so that the output terminal thereof becomes 0V and the input port A/D3 is supplied with 0V. The non-inverting input terminal of the op-amp OP4 is grounded so that the input port A/D4 is supplied with 0V.

The op-amp OP2 is also supplied with a voltage range of 0-5V corresponding to the voltage between the first and second terminals of the capacitor 3.

The inverting input terminal of the op-amp OP2 is connected to the reference voltage supply 12 and the differential amplifier is effective so that the output terminal thereof has a fixed voltage of 0V even the voltage of 0-5V is supplied. As a result, the input port A/D2 is supplied with 0V.

When the microcomputer 7 judges that the control signal from the output port CTL1 is high (H) level, the field effect transistor FET1 is on, and the inputted voltage to the input port A/D2 is 0V, the microcomputer calculates an absolute value of a difference between the digital values V(A/D1) and V(A/D3), |V(A/D1)-V(A/D3)|, converted from the voltages at the input ports A/D1 and A/D3 with the A/D converters based on the input port A/D3 being the reference voltage 0V (ground voltage). The microcomputer 7 multiplies the absolute value by a reverse number (2) of the divider ratio (½) of the divider circuit 10 and stores the calculated result as a measured voltage value of the voltage supply V1 with the range of 0-10V.

When the voltage of the voltage supply V1 is in the range of 10-20V, the voltage between the terminals of the capacitor 3 is divided with 2:1 resulting to the voltage range of 5-10V. The voltage is further divided with the resistors R11-R12 with 2:1 resulting to the voltage range of 2.5-5V and is inputted to the op-amp OP1. The op-amp OP1 amplifies twice the inputted voltage. Since the op-amp OP1 is operated with the voltage of 5V, the output becomes saturated and outputs a constant voltage of 5V. Accordingly, when the voltage supply V1 has a voltage of 10-20V, the input port A/D1 is always supplied with 5V.

The op-amp OP2 is also supplied with a voltage range of 5-10V corresponding to the voltage between the terminals of the capacitor 3. The output terminal of the op-amp OP2 outputs a difference voltage from the reference voltage of 5V connected to the inverting terminal. The output terminal outputs the voltage range of 0-5V. Accordingly, when the voltage supply V1 has the voltage range of 10-20V, the input port A/D2 is always supplied with 0-5V.

When the microcomputer 7 judges that the control signal from the output port CTL1 is high (H) level, the field effect transistor FET1 is on, and the inputted voltage to the input port A/D1 is 5V, the microcomputer calculates a absolute value of a difference between the digital values V(A/D2) and V(A/D3), |V(A/D2)-V(A/D3)|, converted from the voltages at the input ports A/D2 and A/D3 with the A/D converters based on the input port A/D3 being the reference voltage 0V (ground voltage) and adds the full scale voltage of 5V of the A/D converter to the absolute value. The microcomputer 7 multiplies the resulting value by the reverse number (2) of the divider ratio (½) of the divider circuit 10 and stores the calculated result as the measured voltage value of the voltage supply V1 with the range of 10-20V.

Next, the switches S2-S3 are closed. The voltage supply V2, the terminals T2-T3, the switches S2-S3, the capacitor 3 form a closed circuit. Thus, the voltage supply V2 charges the capacitor 3 with a reverse polarity compared with the case of the voltage supply V1.

Then, the switches S2 and S3 are opened and the FET1 is turned off and FET2 is turned on with a low level (L) control signal from the output port CTL1 of the microcomputer 7. The first and second switches 4a and 4b of the sampling switch 4 is closed for the prescribed period of time to supply the voltage between the terminals of the capacitor 3, or the voltage supply V2, to the input ports A/D3 and A/D4 via the sampling switch 4, the divider circuit 10, and the buffer circuit 11.

When the voltage of the voltage supply V2 is in the range of 0-10V, the voltage of the capacitor 3 is divided with the divider circuit 10 in the ratio of 2:1 resulting to 0-5V and divided further with the resistors R15 and R16 in a ratio of 2:1 resulting to 0-2.5V and the resulting voltage is inputted to the op-amp OP3. The inputted voltage is amplified with the op-amp OP3 with amplification of 2 resulting to the range of 0-5V and supplied to the input port A/D3 of the microcomputer 7. Accordingly, when the voltage supply V2 has the voltage in the range of 0-10V, the input port A/D3 is supplied with the voltage in the range of 0-5V.

When the field effect transistor FET2 is turned on, the junction of the resistors R1 and R3 is grounded and the non-inverting input terminal of the op-amp OP1 becomes the ground voltage so that the output terminal thereof becomes 0V and the input port A/D1 is supplied with 0V. The non-inverting input terminal of the op-amp OP2 is grounded and the output terminal thereof becomes 0V so that the input port A/D2 is supplied with 0V.

The op-amp OP4 is also supplied with the voltage range of 0-5V corresponding to the voltage between the first and second terminals of the capacitor 3. The inverting input terminal of the op-amp OP2 is connected to the reference voltage supply 12 of 5V and the differential amplifier is effective so that the output terminal of the op-amp OP4 has a fixed voltage of 0V even the voltage of 0-5V is supplied. As a result, the input port A/D4 is supplied with 0V.

When the microcomputer 7 judges that the control signal from the output port CTL1 is low (L) level, the field effect transistor FET2 is on, and the inputted voltage to the input port A/D4 is 0V, the microcomputer 7 calculates an absolute value of a difference between the digital values V(A/D3) and V(A/D1), |V(A/D3)-V(A/D1)|, converted from the voltages at the input ports A/D3 and A/D1 with the A/D converters based on the input port A/D1 being the reference voltage 0V (ground voltage). The microcomputer 7 multiplies the absolute value by the reverse number (2) of the divider ratio (½) of the divider circuit 10 and stores the calculated result as the measured voltage value of the voltage supply V2 with the range of 0-10V.

When the voltage of the voltage supply V2 is in the range of 10-20V, the voltage between the terminals of the capacitor 3 is divided with 2:1 resulting to the voltage range of 5-10V. The voltage is further divided with the resistors R15-R16 with 2:1 resulting to the voltage range of 2.5-5V and is inputted to the op-amp OP3. The op-amp OP3 amplifies twice the inputted voltage. Since the op-amp 03 is operated with the voltage of 5V, the output becomes saturated and outputs the constant voltage of 5V. Accordingly, when the voltage supply V2 has the voltage of 10-20V, the input port A/D3 is always supplied with 5V.

The op-amp OP4 is also supplied with the voltage range of 5-10V corresponding to the voltage between the terminals of the capacitor 3. The output terminal outputs a difference voltage from the reference voltage of 5V connected to the inverting terminal. The output terminal outputs the voltage range of 0-5V. Accordingly, when the voltage supply V2 has the voltage range of 10-20V, the input port A/D4 is always supplied with 0-5V.

When the microcomputer 7 judges that the control signal from the output port CTL1 is low (L) level, the field effect transistor FET2 is on, and the inputted voltage to the input port A/D1 is 5V, the microcomputer 7 calculates an absolute value of a difference between the digital values V(A/D4) and V(A/D1), |V(A/D4)-V(A/D1)|, converted from the voltages at the input ports A/D4 and A/D1 with the A/D converters based on the input port A/D1 being the reference voltage 0V (ground voltage) and adds the full scale voltage of 5V of the A/D converter to the absolute value. The microcomputer 7 multiplies the resulting value by a reverse number (2) of the divider ratio (½) of the divider circuit 10 and stores the calculated result as the measured voltage value of the voltage supply V2 with the range of 10-20V.

The switches S3-S4, S4-S5, and S5-S6 are operated and calculated results are stored in the microcomputer 7 as the measured voltage values of the voltage supplies V3-V5.

The first embodiment of the method of the voltage measurement for the odd numbered voltage supplies V1, V3, and V5 is summarized as follows. The voltage (0-20V) between the terminals of the voltage supply, or the capacitor 3 (0-20V) is divided to 2:1 with the divider circuit 10 resulting to the voltage of 0-10V. The resulting voltage (0-10V) is separated with the buffer circuit 11 into a first voltage region (0-5V) corresponding to the full scale voltage 5V of the A/D converter and a second voltage region (5-10V) corresponding to an exceeding voltage from the full scale. The field effect transistors FET1 and FET2 are turned on and off, respectively. The voltage of the first voltage region (0-5V) is calculated from the absolute value of the difference between V(A/D1) and V(A/D3), |V(A/D1)-V(A/D3)|, converted from the voltages at the input ports A/D1 and A/D3 (reference voltage) to the digital values V(A/D1) and V(A/D3) with the respective A/D converters. The voltage of the second voltage region (5-10V) is calculated from the value of the absolute difference |V(A/D2)-V(A/D3)| plus 5V (the voltage corresponding to the full scale of the A/D converters) converted from the voltages at the input ports A/D2 and A/D3 to the digital values V(A/D2) and V(A/D3) with the respective A/D converters. The microcomputer 7 multiplies the calculated values by the reverse number (2) of the divider ratio (½) of the divider circuit 10 and stores the calculated results as the measured voltage values of the voltage supplies V1, V3, V5 with the ranges of 0-10V and 10-20V.

The voltage measurement for the even numbered voltage supplies V2 and V4 is achieved in a similar manner with the odd numbered voltage supplies. The voltage (0-20V) between the terminals of the voltage supply, or the capacitor 3 is divided to 2:1 with the divider circuit 10 resulting to the voltage of 0-10V. The resulting voltage (0-10V) is separated with the buffer circuit 11 into the first voltage region (0-5V) corresponding to the full scale voltage 5V of the A/D converter and the second voltage region (5-10V) corresponding to the exceeding voltage from the full scale. The field effect transistors FET1 and FET2 are turned off and on, respectively. The voltage of the first voltage region (0-5V) is calculated from the absolute value of the difference between V(A/D3) and V(A/D1), |V(A/D3)-V(A/D1)|, converted from the voltages at the input ports A/D3 and A/D1 (reference voltage) to the digital values V(A/D3) and V(A/D1) with the respective A/D converters. The voltage of the second voltage region (5-10V) is calculated from the value of the absolute difference |V(A/D4)-V(A/D1)| plus 5V (the voltage corresponding to the full scale of the A/D converters) converted from the voltages at the input ports A/D4 and A/D1 to the digital values V(A/D4) and V(A/D1) with the respective A/D converters. The microcomputer 7 multiplies the calculated values by the reverse number (2) of the divider ratio (½) of the divider circuit 10 and stores the calculated results as the measured voltage values of the voltage supplies V2 and V4 with the ranges of 0-10V and 10-20V.

The divider ratio is 2:1 and the resolution of the A/D converters is 0.005V so that the voltage measurement for the voltage supply with the voltage range of 0-20V is measurable with the resolution of 0.01V.

Accordingly, even when the voltage between the terminals of the capacitor 3 exceeds the full scale voltage of the built-in converters A/D, the voltage measurement is achieved with the resolution near to the resolution of the A/D converters (the resolution reduced by the divider ratio of the divider circuit 10).

When the absolute value of the voltage difference between the input port A/D3 or A/D1, which is the reference voltage and grounded, and the input ports A/D1 and A/D2, or A/D3 and A/D4 is calculated, a variation of the A/D converters van be eliminated so that the improved accuracy measurement becomes possible.

Figure 2:
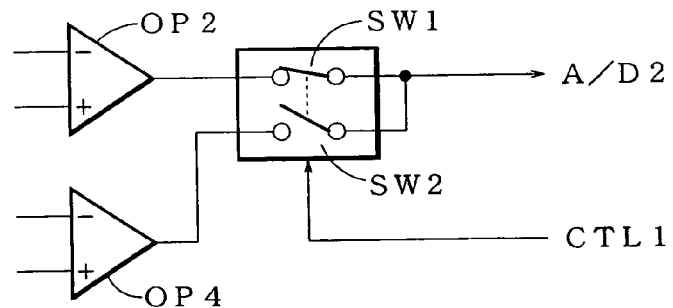
FIG. 2 is an essential circuit showing a first modification of the apparatus of FIG. 1.

FIG. 2 shows an essential circuit of a first modification of the apparatus of the voltage measurement of FIG. 1. Each output of the op-amps OP2 and OP4 is supplied to the input port A/D2 via semiconductor switching elements SW1 and SW2 switched on and off with the control signal from the output port CTL1 of the microcomputer 7. It is necessary to have an information when the odd and even numbered voltage supplies are measured and not always necessary to have an information about the high voltage side (10-20V). With the addition of the switching elements SW1 and SW2, the voltage measurement of the odd numbered and even numbered voltage supplies are measured by setting the switching elements SW1/SW2 on/off and off/on, respectively. Thus, the input port A/D4 and the corresponding A/D converter are removed so that the number of the input ports and A/D converters is reduced from 4 to 3.

Figure 3:
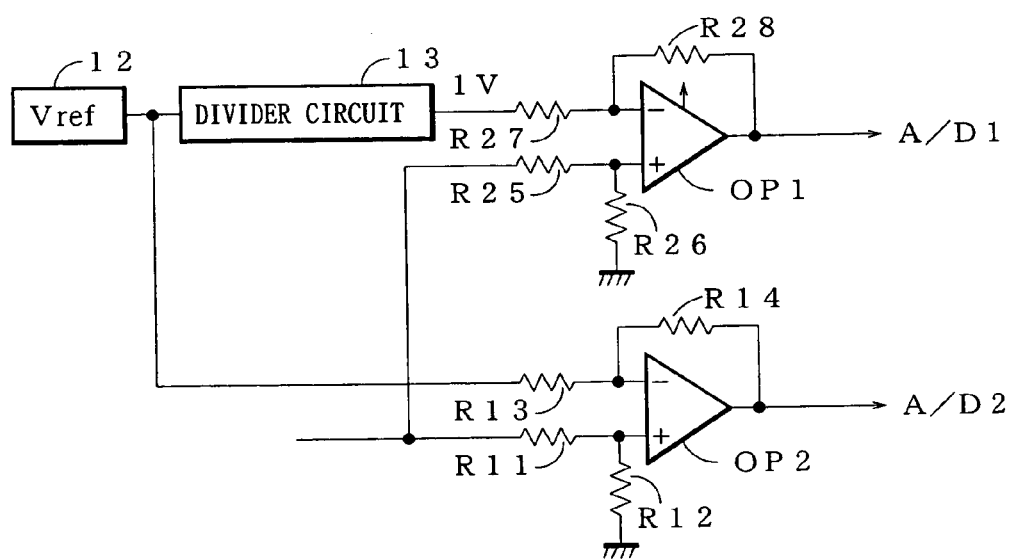
FIG. 3 is an essential circuit showing a second modification of the apparatus of FIG. 1.

FIG. 3 shows an essential circuit of a second modification of the apparatus of the voltage measurement of FIG. 1. A non-inverting input terminal of an op-amp OP1 is connected to a junction of the resistors R1 and R3 via a resistor R25, and connected to the ground via a resistor R26. An inverting terminal of the op-amp OP1 is connected to a reference voltage supply 12 via a resistor R27 and a divider circuit 13 and an output terminal of the op-amp OP1 is connected to a input port A/D1. The op-amp OP1 operates as a differential amplifier. The divider circuit 13 divides the reference voltage supply 12 of 5V to 1V and supplies the voltage to the op-amp OP1 as the reference voltage.

In the second modification, the op-amp OP1 takes the difference between the reference voltage 1V and the input voltage and the op-amp OP2 takes the difference between the reference voltage 5V and the input voltage. Accordingly, in the range of 1-6V of the input voltage divided with the divider circuit 10, the output terminal of the op-amp OP1 outputs 0-5V to the input port A/D1 and in the range of 5-10V of the input voltage divided with the divider circuit 10, the output terminal of the op-amp OP2 outputs 0-5V to the input port A/D2.

Thus, the input voltage of 5-6V is detected with both input ports A/D1 and A/D2 so that the accuracy of the voltage measurement near 5-6V increases. Since the voltage of an actual battery of 12V is seldom below 1V when detected, there is no problem for the apparatus unable to detect the voltage below 1V. As a result, the second modification of the present invention can detect the voltage of 1-10V (the voltage of the voltage supply of 2-20V) with a high accuracy.

Figure 4:
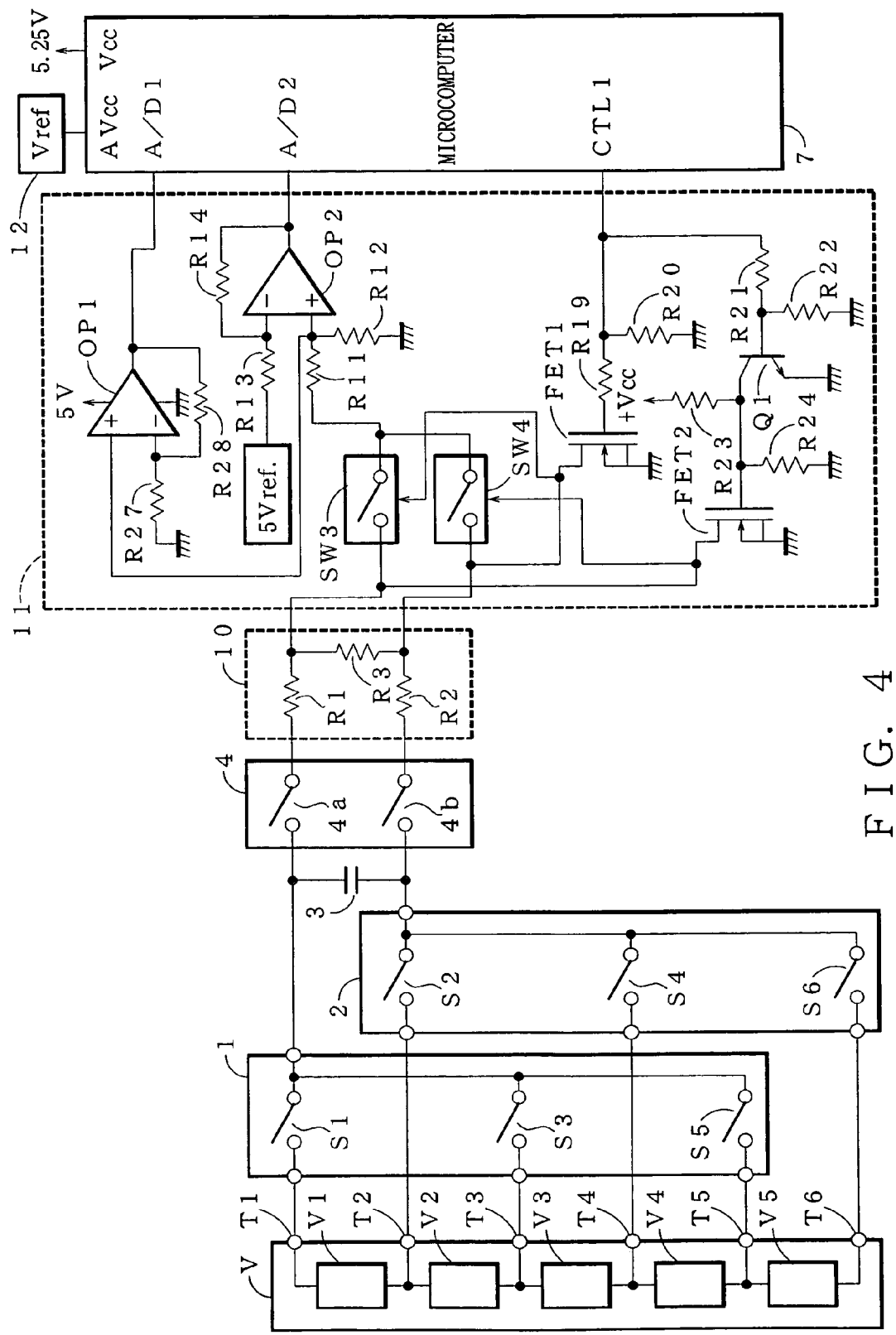
FIG. 4 is a circuit of a second embodiment of an apparatus of voltage measurement of the present invention.

FIG. 4 shows a circuit of a second embodiment of an apparatus of voltage measurement utilizing the method of the present invention. The apparatus of voltage measurement includes, similar to the apparatus of FIG. 1, a first multiplexer 1 and second multiplexer 2 connected to terminals T1-T6 of a high voltage supply V, a bipolar capacitor 3, a sampling switch 4, a microcomputer 7, a divider circuit 10, and a buffer circuit 11. The microcomputer 7 and buffer circuit 11 have different configurations compared to those of the apparatus of FIG. 1.

In the microcomputer 7 of FIG. 4, the input ports A/D3 and A/D4 are deleted from the microcomputer 7 of FIG. 1.

In the buffer circuit 11 of FIG. 4, constituent elements such as op-amps OP3 and OP4 connected between the divider circuit 10 and the input ports A/D3 and A/D4 of FIG. 1 are deleted from the buffer circuit 11 of FIG. 1. The buffer circuit 11 has semiconductor switching elements SW3 and SW4 between a resistor R11 connected to a non-inverting input terminal of an op-amp OP2 and junctions of resistors R1/R3 and resistors R2/R3, respectively. The switching elements SW3 and SW4 are turned on/off with a control signal outputted from field effect transistors FET1 and FET2.

An operation of the apparatus of voltage measurement with the flying capacitor method is described below.

When voltages of odd numbered voltage supplies are measured, a high level (H) control signal outputted from a output terminal CTL1 of the microcomputer 7 turns on a field effect transistor FET1 and off a field effect transistor FET2 to close the switching elements SW3 and open the switching element SW4. Then, a first and second switches 4a and 4b of the sampling switch 4 are closed for a prescribed period of time.

A junction of the resistors R2-R3 of the divider circuit 10 is grounded. Accordingly, the voltage between terminals of the charged capacitor 3, or the odd numbered voltage supply, is supplied to input ports A/D1 and A/D2 via the sampling switch 4, the divider circuit 10, and the buffer circuit 11. The microcomputer 7 reads the voltages supplied to the input ports A/D1 and A/D2 as the measured voltage values of the odd numbered voltage supply with the reference voltage being the ground. As in the case with the first embodiment, the voltage supplied to the input port A/D1 is stored in the microcomputer 7 as the measured voltage value of the odd numbered voltage supply of 0-10V and the voltage supplied to the input port A/D2 is stored in the microcomputer 7 as the measured voltage value of the odd numbered voltage supply of 10-20V.

When voltages of even numbered voltage supplies are measured, a low level (L) control signal outputted from the output terminal CTL1 of the microcomputer 7 turns off the field effect transistor FET1 and on the field effect transistor FET2 to open the switching element SW3 and close the switching element SW4. Then, the first and second switches 4a and 4b of the sampling switch 4 are closed for the prescribed period of time.

A junction of the resistors R1 and R3 of the divider circuit 10 is grounded. Accordingly, the voltage between the terminals of the charged capacitor 3, or the even numbered voltage supply, is supplied to the input ports A/D1 and A/D2 via the sampling switch 4, the divider circuit 10, and the buffer circuit 11. The microcomputer 7 reads the voltages supplied to the input ports A/D1 and A/D2 as the measured voltage values of the even numbered voltage supply with the reference voltage being the ground. The voltage supplied to the input port A/D1 is stored in the microcomputer 7 as the measured voltage value of the even numbered voltage supply of 0-10V and the voltage supplied to the input port A/D2 is stored in the microcomputer 7 as the measured voltage value of the even numbered voltage supply of 10-20V.

The second embodiment of the apparatus of voltage measurement reduces the input ports to half of those of the first embodiment. The op-amps in the buffer circuit is also reduced to half. The voltage measurements of the odd and even numbered voltage supplies use the same circuit and ports so that an error due to the input channel of the voltage supply between the odd and even numbered voltage supplies does not occur.

The embodiments of the present invention are not limited thereto but any modification or application is possible.

In the above embodiments, the switches S1-S6 of the multiplexers 1-2 and the switches 4a-4b of the sampling switch 4 are automatically controlled with the microcomputer 7 but they are manually closed or opened.

In the above embodiments, when the voltage between the terminals of the capacitor 3, or the voltage supply, exceeds the full scale of the built-in A/D converters of the microcomputer 7, the voltage of the voltage supply is calculated by adding the full scale voltage (5V) to the measured voltage value of the second voltage region measured at the input port A/D2 (or A/D4). However, the measured voltage value of the first voltage region measured at the input port A/D1 (or A/D3) may be added to the measured voltage value of the second voltage region measured at the input port A/D2 (or A/D4).

The above embodiments of the present invention utilize the flying capacitor method for the voltage measurement. Other methods without using the flying capacitor method, such as a direct measurement method or non-multiple measurement method, can be adapted to the voltage measurement as far as the capacitor is charged.

The first and second embodiments have the divider circuit 10 between the sampling switch 4 and the buffer circuit 11. The divider circuit 10 is required when the voltage to be measured is twice or more than the full scale of the built-in A/D converters of the microcomputer 7. When the voltage to be measured is less than twice the full scale of the built-in A/D converters, it is not necessary to arrange the divider circuit. In this case, it is not necessary for the microcomputer 7 to multiple the reverse value of the divided ratio of the divider circuit 10 to the absolute value. When the apparatus of voltage measurement does not have the divider circuit 10, the resolution of the apparatus is not reduced due to the dividing so that the apparatus has the same resolution as the built-in A/D converters.

Each apparatus of FIGS. 1 and 4 has a separated reference voltage supply 12. The op-amp utilized as the buffer can be utilized for the reference voltage.

Figure 5:
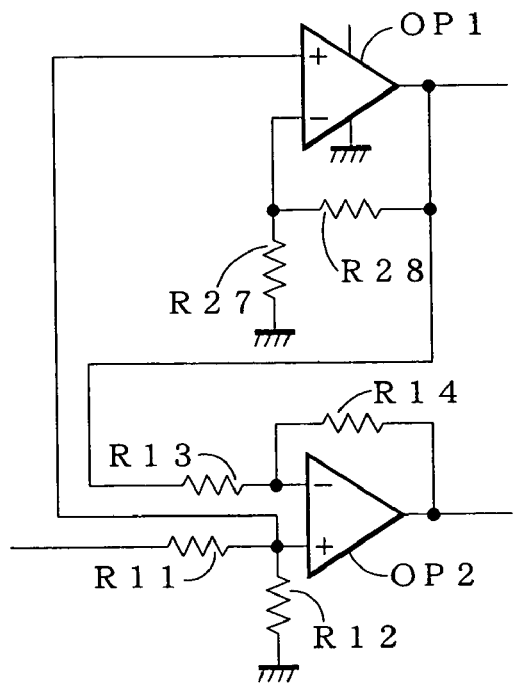
FIG. 5 is an essential circuit showing another modification of the apparatus of the present invention.
Figure 7:
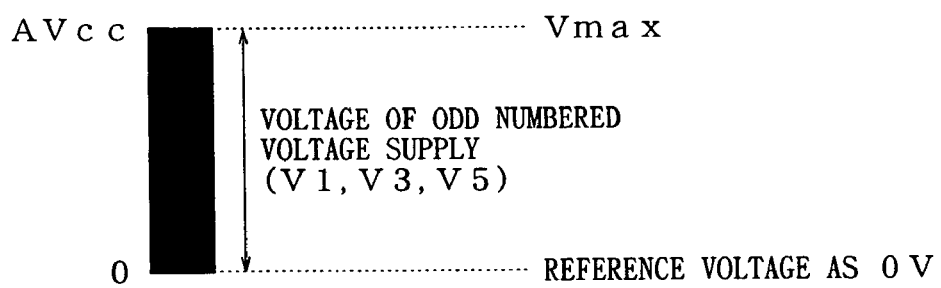
FIG. 7 illustrates an operation of the apparatus of voltage measurement of FIG. 6.
Figure 7:
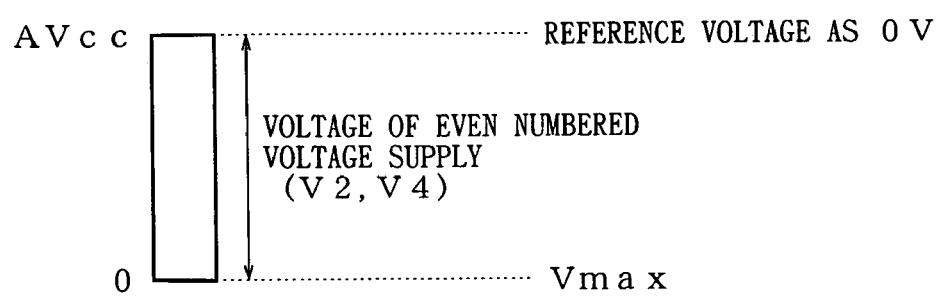
Figure 6:
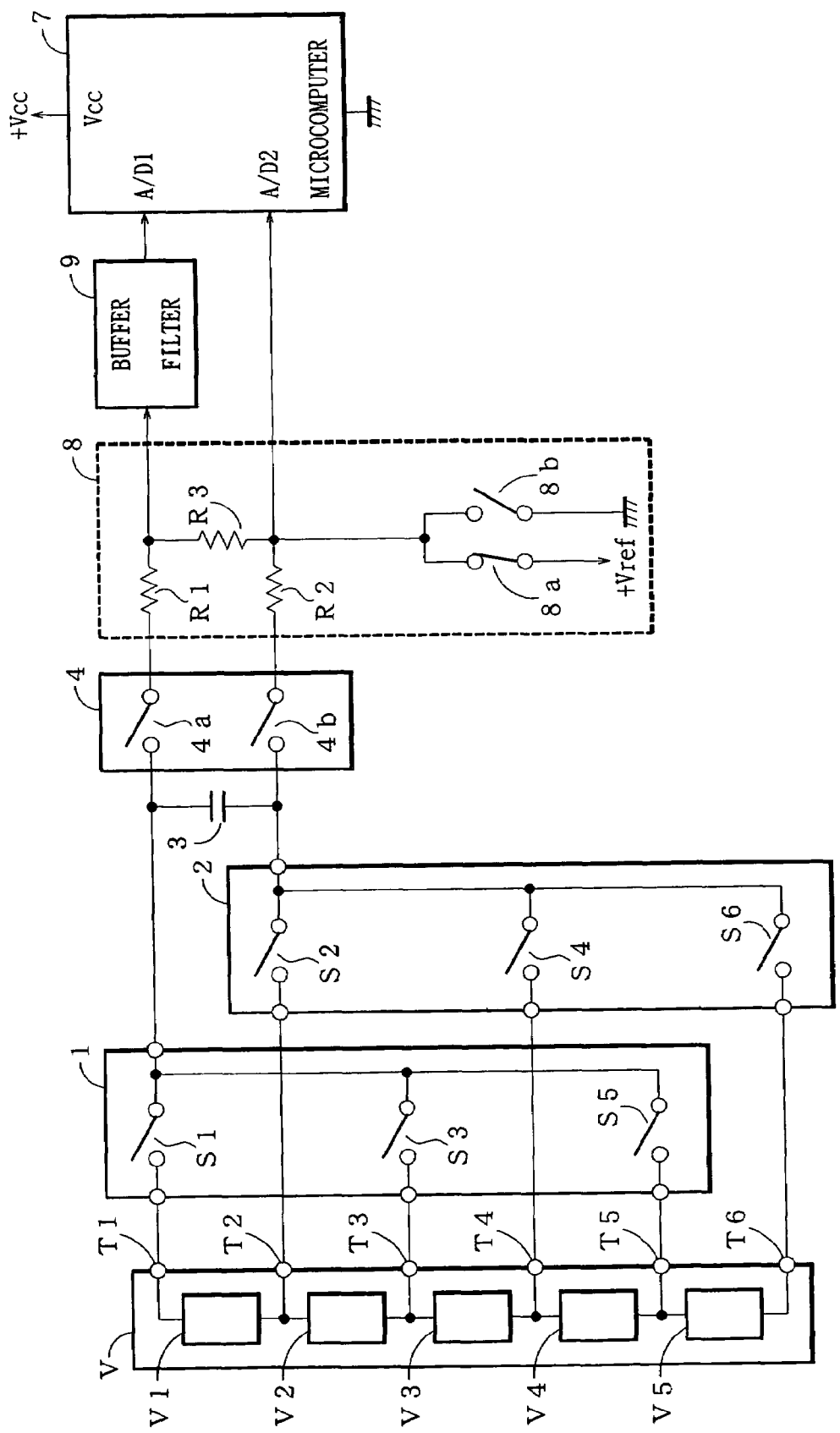
FIG. 6 is a circuit showing a conventional apparatus of voltage measurement utilizing a flying capacitor method.

As shown in FIG. 5, the reference voltage 12 is removed from the op-amp OP2 and the output terminal of the op-amp OP1 is connected to the resistor R13. In a similar manner, the reference voltage 12 is removed from the op-amp OP4 and the output terminal of the op-amp OP3 is connected to the resistor R17.

The op-amp OP1 can be utilized as a reference voltage in place of the reference voltage 12. Since the output terminal of the op-amp OP1 is always 5V, the op-amp OP1 can be utilized as the reference voltage when the voltage of the voltage supply is 10-20V.

What is claimed is:

1. A method of voltage measurement comprising the steps of:
charging a capacitor with a voltage supply to be measured about voltage;
converting a voltage between terminals of the capacitor charged or an equivalent voltage thereof from analog to digital value with an analog/digital (A/D) converter;
evaluating a measured voltage value from the digital value; and
calculating the voltage of the voltage supply from the measured value, wherein
when the voltage between the terminals of the capacitor or the equivalent voltage is higher than a full scale of the A/D converter, the voltage is separated into a first voltage region corresponding to the full scale of the A/D converter and a second voltage region corresponding to a voltage exceeding the full scale of the A/D converter, and wherein voltages of the first and second voltage regions are converted from analog to digital with respective A/D converters.

2. The method of voltage measurement as claimed in claim 1, wherein said voltage of the voltage supply is calculated by adding the measured voltage value of the second voltage region to the voltage of the full scale of the A/D converter.

3. The method of voltage measurement as claimed in claim 1, wherein said voltage of the voltage supply is calculated by adding the measured voltage value of the first voltage region to the measured voltage value of the second voltage region.

4. An apparatus of voltage measurement comprising:
a buffer circuit for separating a voltage between terminals of a capacitor or an equivalent voltage into a first voltage region corresponding to a full scale of an analog/digital (A/D) converter and a second voltage region corresponding to a voltage exceeding the full scale of the A/D converter when the voltage between the terminals of the capacitor charged or the equivalent voltage is higher than the full scale of the A/D converter;
said A/D converters corresponding to the first and second voltage regions for converting the voltages of the respective regions from analog to digital values; and
a voltage measurement device for evaluating a measured voltage value from the digital values and calculating the voltage of the voltage supply.

5. An apparatus of voltage measurement comprising:
a capacitor to be charged with a voltage supply;
a first multiplexer for connecting odd numbered terminals of voltage supplies connected in series to the capacitor;
a second multiplexer for connecting even numbered terminals of the voltage supplies connected in series to the capacitor;
a sampling switch for supplying a voltage between terminals of the capacitor or an equivalent value to a voltage measurement device;
a buffer circuit for separating the voltage between the terminals of the capacitor or the equivalent voltage into a first voltage region corresponding to a full scale of an analog/digital (A/D) converter and a second voltage region corresponding to a voltage exceeding the full scale of the A/D converter when the voltage between the terminals of the capacitor or the equivalent voltage is higher than the full scale of the A/D converter;
said A/D converters corresponding to the first and second voltage regions for converting the voltages of the respective regions from analog to digital values; and
a voltage measurement device for evaluating a measured voltage value from the digital values and calculating the voltage of the voltage supply.

6. The apparatus of voltage measurement as claimed in claim 4, wherein said voltage measurement device calculates the voltage of the voltage supply by adding the measured voltage value of the second voltage region to the voltage of the full scale of the A/D converter.

7. The apparatus of voltage measurement as claimed in claim 4, wherein said voltage measurement device calculates the voltage of the voltage supply by adding the measured voltage value of the first voltage region to the measured voltage value of the second voltage region.

8. The apparatus of voltage measurement as claimed in claim 4, wherein said buffer circuit supplied with a driving voltage comparable to the full scale has a buffer amplifier supplied with the voltage between the terminals of the capacitor or the equivalent voltage and a differential amplifier supplied with a reference voltage equal to the full scale of the A/D converter at one input terminal and the voltage between the terminals of the capacitor at another input terminal, and wherein said A/D converter has a first A/D converter for converting an output voltage of the buffer amplifier from analog to digital and a second A/D converter for converting an output voltage of the differential amplifier from analog to digital.

9. The apparatus of voltage measurement as claimed in claim 4, further comprising a divider circuit for dividing the voltage between the terminals of the capacitor and supplying the voltage divided to the buffer circuit as the equivalent voltage.

10. The apparatus of voltage measurement as claimed in claim 9, wherein
a sampling switch has a first switch connected to a first terminal of the capacitor and a second switch connected to a second terminal of the capacitor, wherein
said divider circuit has a first resistor, one terminal of which is connected to the first switch, a second resistor, one terminal of which is connected to the second switch, and a third resistor connected to the other non-connected terminal of the first and second resistors, and wherein
said voltage measurement device has a first switching unit for grounding the one terminal of the third resistor when measuring the voltage of the odd numbered voltage supply and a second switching unit for grounding the another terminal of the third resistor when measuring the voltage of the even numbered voltage supply.

11. The apparatus of voltage measurement as claimed in claim 8, wherein said output voltage of the buffer amplifier is supplied to another input terminal of the differential amplifier and the buffer amplifier operates as the reference voltage supply.

12. The apparatus of voltage measurement as claimed in claim 10, wherein said output voltage of the buffer amplifier is supplied to another input terminal of the differential amplifier and the buffer amplifier operates as the reference voltage supply.

* * * * *